(12) United States Patent
Hoegerl et al.

(10) Patent No.: US 7,318,307 B2
(45) Date of Patent: Jan. 15, 2008

(54) METHOD AND DEVICE FOR PACKAGING AND TRANSPORTING ELECTRONIC COMPONENTS

(75) Inventors: Juergen Hoegerl, Regensburg (DE); Thomas Pfaffelhuber, München (DE)

(73) Assignee: Infineon Technologies AG, Munich (DE)

( * ) Notice: Subject to any disclaimer, the term of this patent is extended or adjusted under 35 U.S.C. 154(b) by 197 days.

(21) Appl. No.: 10/507,935

(22) PCT Filed: Mar. 18, 2003

(86) PCT No.: PCT/DE03/00886

§ 371 (c)(1),
(2), (4) Date: Jul. 18, 2005

(87) PCT Pub. No.: WO03/079745

PCT Pub. Date: Sep. 25, 2003

(65) Prior Publication Data

US 2006/0011508 A1    Jan. 19, 2006

(30) Foreign Application Priority Data

Mar. 18, 2002 (DE) ................ 102 11 993

(51) Int. Cl.
*B65B 1/04* (2006.01)
(52) U.S. Cl. .......................... 53/467; 53/442; 53/473; 53/173; 53/557
(58) Field of Classification Search .......... 53/440–442, 53/467, 469, 473, 478, 127, 173, 557, 558, 53/591, 284.5, 284, 281, 266.1; 206/713, 206/717
See application file for complete search history.

(56) References Cited

U.S. PATENT DOCUMENTS

| | | | |
|---|---|---|---|
| 4,298,120 A | 11/1981 | Kaneko et al. | |
| 4,753,061 A * | 6/1988 | Braden et al. | 53/471 |
| 5,007,534 A | 4/1991 | Tamaki et al. | |
| 5,203,143 A * | 4/1993 | Gutentag | 53/452 |
| 5,325,654 A * | 7/1994 | Juntunen et al. | 53/440 |
| 5,390,472 A * | 2/1995 | Weiler et al. | 53/412 |
| 5,597,074 A | 1/1997 | Ko | |
| 5,729,963 A * | 3/1998 | Bird | 53/471 |
| 5,964,352 A | 10/1999 | Shoji | |
| 6,082,603 A | 7/2000 | Takada et al. | |
| 6,101,790 A * | 8/2000 | Mori et al. | 53/453 |
| 6,149,010 A | 11/2000 | Tanaka et al. | |
| 6,205,745 B1 * | 3/2001 | Dudderar et al. | 53/397 |
| 6,216,419 B1 * | 4/2001 | Sakurai | 53/139.5 |
| 6,264,704 B1 | 7/2001 | Minamitani et al. | |
| 6,820,401 B2 * | 11/2004 | Behnke | 53/486 |
| 6,823,652 B2 * | 11/2004 | Troxtell, Jr. | 53/427 |
| 7,040,171 B2 * | 5/2006 | McGee et al. | 73/662 |
| 2003/0079446 A1 * | 5/2003 | Behnke | 53/473 |
| 2003/0101692 A1 * | 6/2003 | Behnke | 53/471 |

FOREIGN PATENT DOCUMENTS

| | | |
|---|---|---|
| DE | 100 32 415 | 10/2001 |
| JP | 2001085360 | 3/2001 |

* cited by examiner

*Primary Examiner*—Hemant M. Desai
(74) *Attorney, Agent, or Firm*—Dicke, Billig & Czaja PLLC

(57) ABSTRACT

The invention relates to an apparatus and a method for packaging and for transporting electronic devices. The devices include coverings made of a material that shrinks under the action of temperature that are pressed into receptacles of a belt-type carrier body. Electronic devices are inserted into the open front sides of said coverings. A belt top side and underside are in each case closed off with a covering sheet, after which the belt-type carrier body is heated.

11 Claims, 6 Drawing Sheets

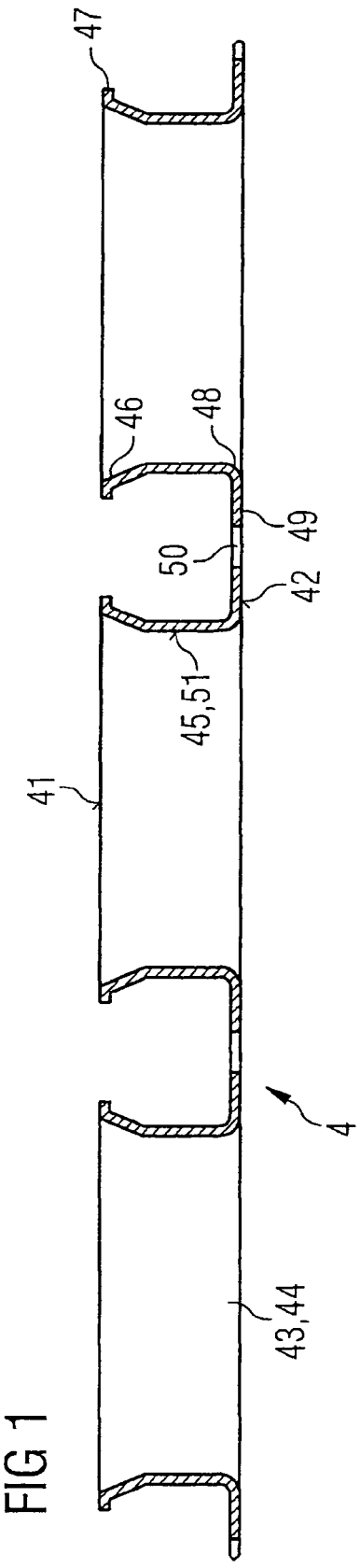
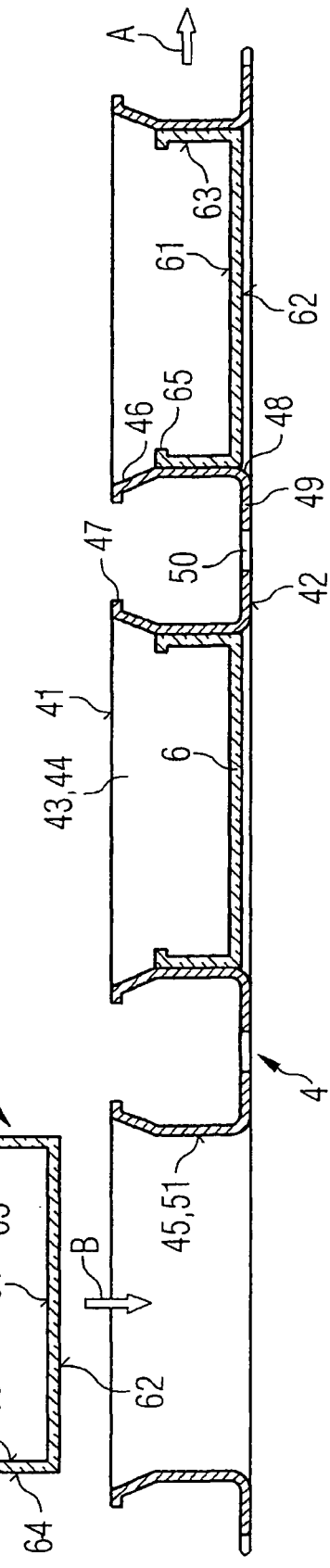

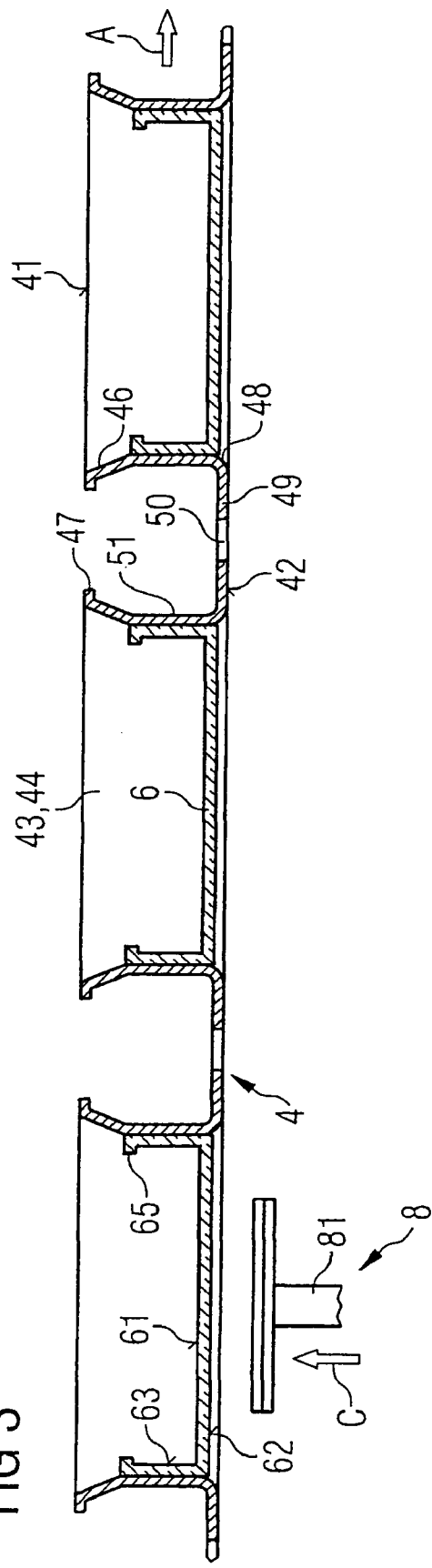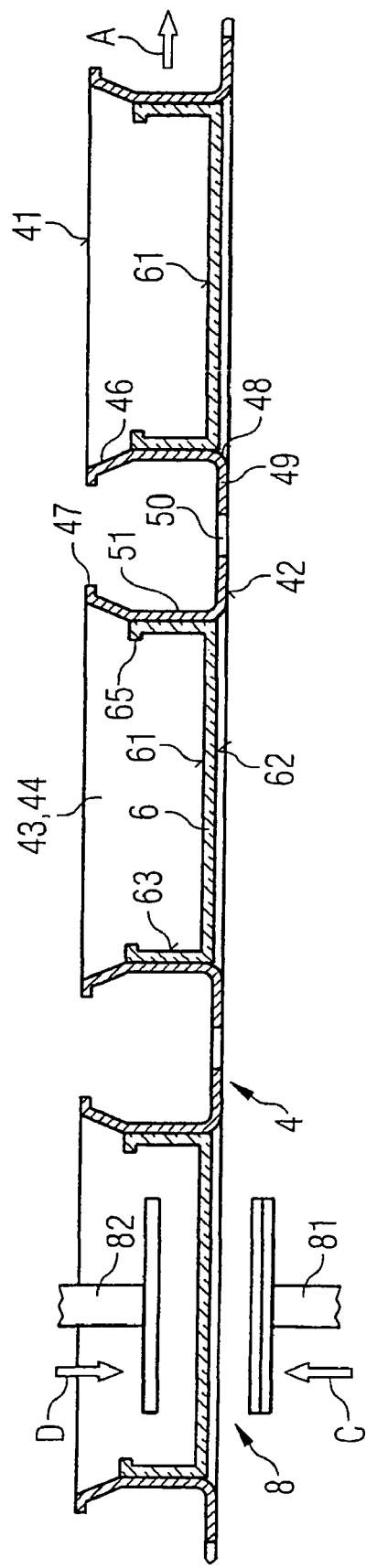

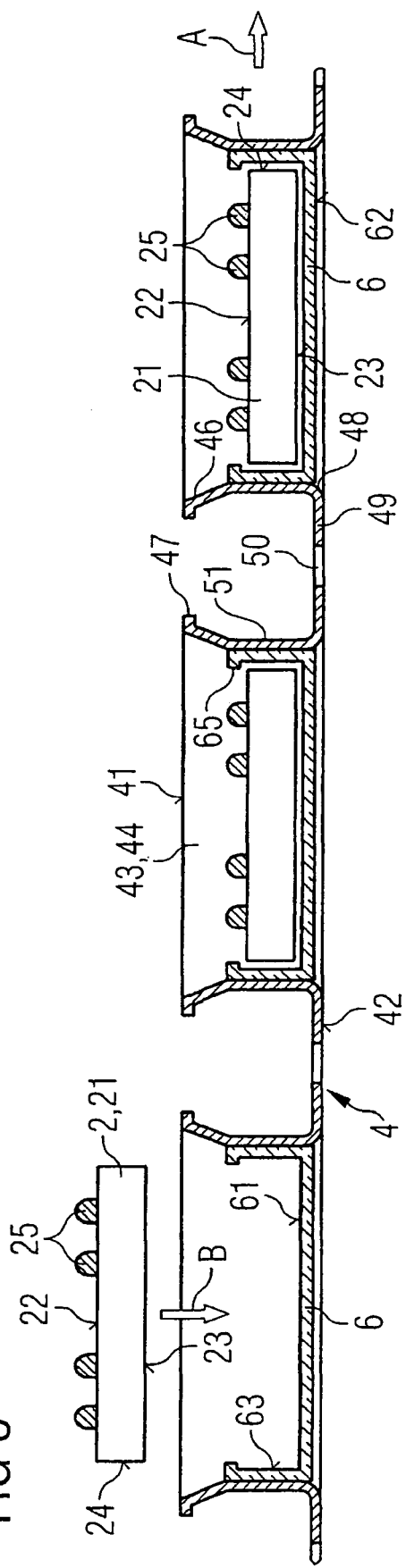

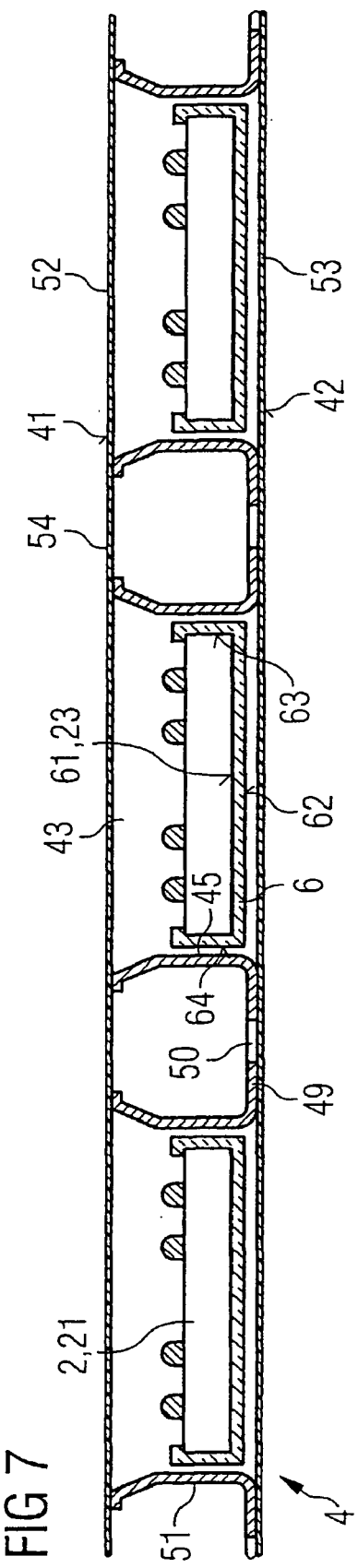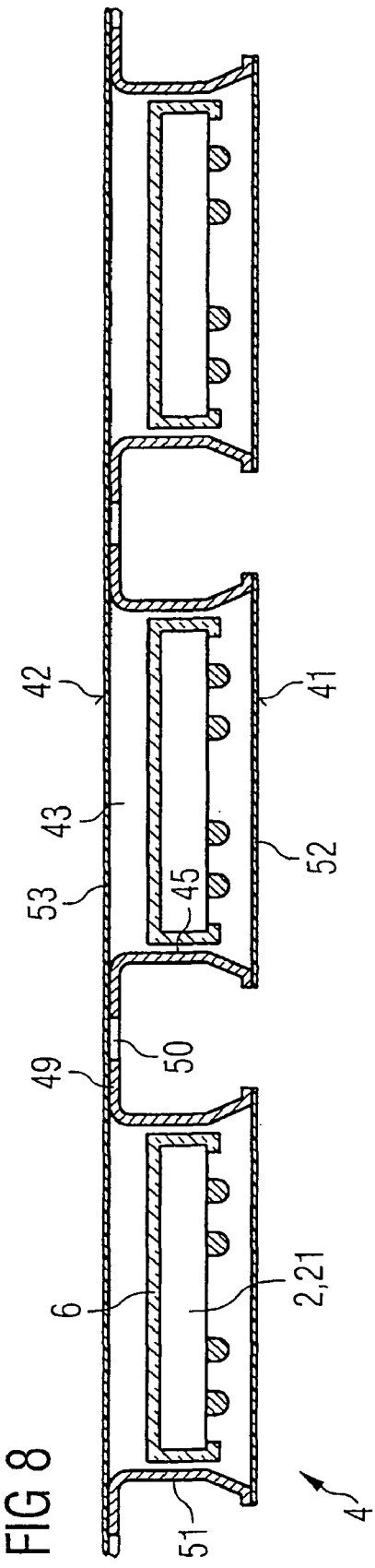

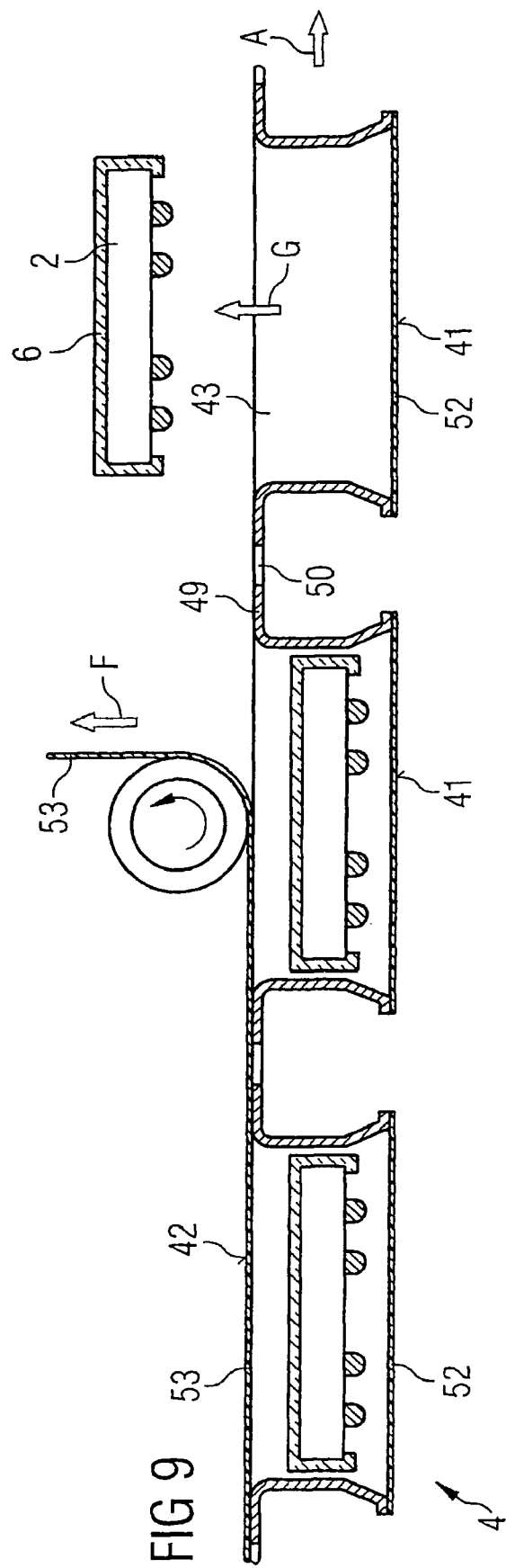

METHOD AND DEVICE FOR PACKAGING AND TRANSPORTING ELECTRONIC COMPONENTS

CROSS REFERENCE TO RELATED APPLICATIONS

This Utility Patent Application claims the benefit of the filing date of German Application No. DE 102 11 993.7, filed Mar. 18, 2002, and International Application No. PCT/DE03/00886, filed Mar. 18, 2003, both of which are herein incorporated by reference.

BACKGROUND

The invention relates to a method and to an apparatus for packaging and for transporting electronic devices, in particular semiconductor components.

The fabrication of electronic devices such as semiconductor chips or other discrete semiconductor components is usually effected on so-called semiconductor wafers to which a large number of identical semiconductor structures are applied in rows and columns. Singulation to form individual semiconductor components or chips is subsequently effected by sawing. This method is referred to as "wafer scale assembly".

The sawing itself causes fewer problems with regard to the risk of damage than the later handling of the semiconductor components or chips and the processing thereof to form semiconductor devices. The chip edges are extremely sensitive to mechanical damage, with the result than an effective protection is necessary which is effective not only at the module level but already at the component level, that is, for the individual semiconductor chips.

A mechanical protection of the semiconductor chips may be realized by means of an additionally applied layer on the rear side of the semiconductor wafer, which is later separated together with said semiconductor wafer. For example, such a layer may consist in a thin resist layer. However, even such an additional layer or resist layer cannot ensure a reliable protection of the sensitive chip edges. At the module level, use may be made of so-called heat spreaders that cover the complete module. For example, these are plastic caps in the form of heat sinks or the like. However, during the handling of the devices, there is no effective edge protection for the chip edges up to the processing to form modules.

One possibility for the handling of very small electronic devices having typical housing sizes in the millimeters range consists in picking up and setting down by means of vacuum forceps. Each process of rotation and turning in order to bring the electronic devices into an envisaged packaging direction either in the back position or in the normal position means a high outlay and is associated with the risk of such a device being lost in the course of rotation and turning. In the course of this handling, too, there is the risk of damage to edges of the electronic devices.

An apparatus and a method for handling and for transporting electronic devices are disclosed in JP 2001 085 360 A. In this case, electronic components are applied to a self-adhesive layer of a carrier sheet that shrinks under the action of heat, which is subsequently cut in specific positions; In this way, it is possible to combine one or a plurality of electronic devices in a package which permits damage-free handling and protected transport of the devices.

SUMMARY

One embodiment of the invention provides a method and an apparatus for packaging and for transporting electronic devices that enable the devices to be handled effectively and as carefully as possible.

In the case of a method according to one embodiment of the invention for packaging and for transporting electronic devices, coverings made of a material that shrinks largely irreversibly under the action of temperature are pressed into receptacles of a belt-type carrier body that are open on both sides, electronic devices in each case being inserted into the open front sides of said coverings. In the case of the method, furthermore, a belt top side and also a belt underside of the belt-type carrier body are in each case closed off with a covering sheet, after which the belt-type carrier body with the coverings situated therein and devices inserted therein is heated.

By virtue of the heating, the electronic device is enclosed by the shrinking material of the covering in a positively locking manner. At the same time, the covering is released from its friction- or force-locking connection to the receptacle of the carrier body, so that the electronic devices can be withdrawn without problems. This method according to one embodiment of the invention makes it possible to develop known processes further, heating of the belt-type carrier body being used for a plurality of purposes. Firstly, the belt carrier is connected to the emplaced covering sheets at the top side and underside in such a way as to produce a closed cavity for each electronic device. Secondly, the thermal process initiates shrinking of the coverings, as a result of which this is placed around the chip in a positively locking manner. Thirdly, by virtue of the shrinking of the coverings, the latter are released from the walls of the receptacles of the carrier body. The semiconductor chip provided with the coverings now lies free in the closed-off receptacle of the belt carrier. Thermal energy can be coupled in in various ways, for example, by thermal conduction, thermal convection or thermal radiation.

One embodiment of the invention provides for shell-type coverings to be pressed into the receptacles of the belt-type carrier body to produce a friction- or force-locking fit. The carrier body provided with the pressed-in coverings thus constitutes the actual initial state in that a belt carrier wound onto a roll constitutes the state of delivery to an assembly line. The rolled-up carrier body provided with the pressed-in coverings may thus be delivered to a corresponding placement apparatus in order to be populated with electronic devices, after which the finished populated carrier body is prepared for the withdrawal of the devices on an assembly line.

In accordance with a further embodiment of the invention, the coverings are provided with a marking and/or indexing by means of an indexing apparatus after insertion into the belt-type carrier body and before they are populated with electronic devices. After being unwound from the roll, the individual coverings may be inscribed. This may be effected for example by an indexing apparatus in the form of a stamp or a laser. In order to prevent the covering from slipping in the course of stamping, it is possible, for example, for a counterbearing to counteract the forces of the stamp from the opposite side. During laser inscription, an abutment may function as a heat sink.

In addition, the belt-type carrier body may be provided with an indexing before or after the application of the lower or upper covering sheets. Such an indexing may be provided, for example, in edge regions of the belt-type carrier body that are not covered by an upper or lower covering sheet. The indexing may be furnished on the carrier body in the form of cutouts having different lengths and/or spacings or else in the form of coded imprints.

One embodiment of the invention provides for the coverings, after heating, to be released from the inner walls of the receptacles of the belt-type carrier body, and for the electronic devices provided with the covering to have limited mobility within the now closed-off receptacles. The electronic devices are firmly enclosed by the shrinking coverings during heating. The electronic devices thus have limited mobility in the receptacles of the belt-type carrier body, a complete rotation about one of the axes in each case being prevented in order that the electronic devices are found in a defined position at any time in the event of withdrawal.

In accordance with a further embodiment of the invention, connecting sections of an upper and/or a lower covering sheet between adjacent receptacles are removed after the application of the covering sheet to the belt top side or underside. Before being rolled up, the belt carrier may thereby be fashioned such that its flexibility is increased and the rolling-up process is facilitated. This may be effected by indentation or partial removal of one of the covering materials. The populated belt carrier can then be wound onto a roll more easily.

An apparatus according to one embodiment of the invention for packaging and for transporting electronic devices has a belt-type carrier body with a belt top side and a belt underside with receptacles that are open on both sides between belt top side and underside. Coverings made of a material that shrinks largely irreversibly under the action of temperature are in each case pressed into the receptacles, the electronic devices in each case being inserted into the open front sides of said coverings. The unpopulated coverings are fixed in the belt in a positively locking and/or force-locking manner. Furthermore, the belt top side and the belt underside are in each case closed off with a covering sheet, which can be removed and can be applied optionally in respect of the side for the insertion and withdrawal of electronic devices.

This apparatus according to the invention enables packaged electronic devices to be securely transported and enables them to be withdrawn in a defined position at an envisaged installation or assembly location.

In one embodiment, the belt-type carrier body has at least a single row with an arbitrary number of receptacles, as a result of which the belt-type carrier body can be wound onto a roll without any problems. Such a single-row belt can be handled without any problems by means of conventional processing and handling machines on production lines for semiconductor chips and electronic devices.

Optionally, the belt-type carrier body may also have two or more rows of receptacles arranged next to one another, which significantly increases its transport capacity.

In accordance with one embodiment of the invention, a placement direction of the apparatus is optionally identical or opposite to a withdrawal direction. Depending on the handling equipment present, the electronic devices can thus be picked up by their active front sides or by their passive rear sides and be used at their envisaged installation location.

A further method according to the invention for the placement and for the withdrawal of electronic devices of an apparatus in accordance with one of the embodiments described above can be populated with electronic devices in the rear side position which are to be withdrawn in the normal position. The method comprises the following method steps of:

populating receptacles of a belt-type carrier body that are open on both sides with coverings that are shrinkable under the action of temperature and the production of a friction- or force-locking connection, populating the coverings with electronic devices, closing off a belt top side and a belt underside with an upper or lower covering sheet, heating the apparatus to produce a positively locking connection between coverings and electronic devices, turning the apparatus through 180°, withdrawing the electronic devices in the normal position with the removal of the lower covering sheet—now lying at the top—of the belt underside.

In the case of this method according to the invention for the placement and for the withdrawal of electronic devices, the latter can be placed in the rear side position and be withdrawn in the normal position. In other words, the electronic devices bear with their passive rear sides in the coverings.

An alternative method for the placement and for the withdrawal of electronic devices of an apparatus in accordance with one of the embodiments described above can be populated with electronic devices in the normal position which are to be withdrawn in the normal position. The method comprises the following steps of:

populating receptacles of a belt-type carrier body that are open on both sides with coverings that are shrinkable under the action of temperature and the production of a friction- or force-locking connection, populating the coverings with electronic devices, closing off a belt top side and a belt underside with an upper or lower covering sheet, heating the apparatus to produce a positively locking connection between coverings and electronic devices, withdrawing the electronic devices in the normal position with the removal of the upper covering sheet of the belt top side.

In this case, the devices are to be withdrawn in the same position as they have been placed.

Preference may be given to one method or the other depending on the available handling equipment.

A partial removal of the upper covering sheet in the regions between respectively adjacent receptacles makes it easier to wind up the belt.

In one embodiment of the invention, the starting point is a belt carrier system with index holes and a multiplicity of cavities open on both sides, which are referred to as receptacles in the present context. This belt carrier system may be produced for example from a thermoformed plastic. Coverings are pressed into the cavities of the belt carrier system. The clamping of the coverings within the receptacles of the belt carrier system may be effected exclusively by friction or be supported for example by a peripheral groove.

The belt carrier populated in this way may subsequently be wound onto a roll and constitute the state of delivery to an assembly line.

After the empty belt has been unwound from the roll, the individual caps of the coverings may be inscribed, which may be effected by means of a stamp or laser. In order to prevent the covering from slipping in the course of stamping, it is possible, for example, for an abutment to counteract the forces of the stamp from the opposite side. In the course of laser inscription, an abutment may function as a heat sink.

Afterward, electronic devices, for example semiconductor chips, are inserted into the open front sides of the coverings with the external contacts still at the top. In order to close off the receptacles that are open at the top and bottom in the belt carrier system and later to form a closed cavity, the belt carrier is coated with a further material on the top side and underside.

A thermal process is employed. Firstly, the belt carrier is connected to the emplaced material at the top side and underside in such a way that a closed cavity is produced. Secondly, the thermal process initiates shrinking of the coverings, as a result of which the latter are placed around the electronic devices in a positively locking manner. Thirdly, the coverings are released from the walls of the cavity of the belt carrier as a result of the changes in size of said coverings. The chip provided with the covering now lies free in the now closed-off cavity of the belt carrier.

Before being rolled up, the belt carrier may be fashioned in such a way that its flexibility is increased and the rolling-up process is facilitated. This may be effected by indentation or partial removal of one of the covering materials. The populated belt carrier is then wound onto a roll.

In order to withdraw the semiconductor chip—now permanently protected with the covering—from the belt carrier, the covering material is stripped away and the device is withdrawn. The stiffness of the belt carrier and covering material should be chosen such that a mechanical stressing of the cavity formed does not lead to a deformation thereof and thus to damage to the in part sensitive external contacts of the electronic devices.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a diagrammatic partial cross section through a belt-type carrier body with receptacles that are open on both sides.

FIG. 2 illustrates the belt-type carrier body in accordance with FIG. 1 with coverings pressed into the receptacles.

FIG. 3 illustrates a method step in which the coverings are provided with a marking or indexing on the rear side.

FIG. 4 illustrates a method step in which an indexing device with stamp and counterbearing is pressed onto the coverings.

FIG. 5 illustrates, in a subsequent method step, the introduction of electronic devices into the coverings.

FIG. 7 illustrates a subsequent method step in which the coverings are shrunk by heating and are released from the inner walls of the receptacles.

FIG. 8 illustrates a turned belt-type carrier body in which parts of the upper covering sheet are removed.

FIG. 9 illustrates a final method step in which the electronic devices are withdrawn from the belt-type carrier body.

DETAILED DESCRIPTION

Figure 6:
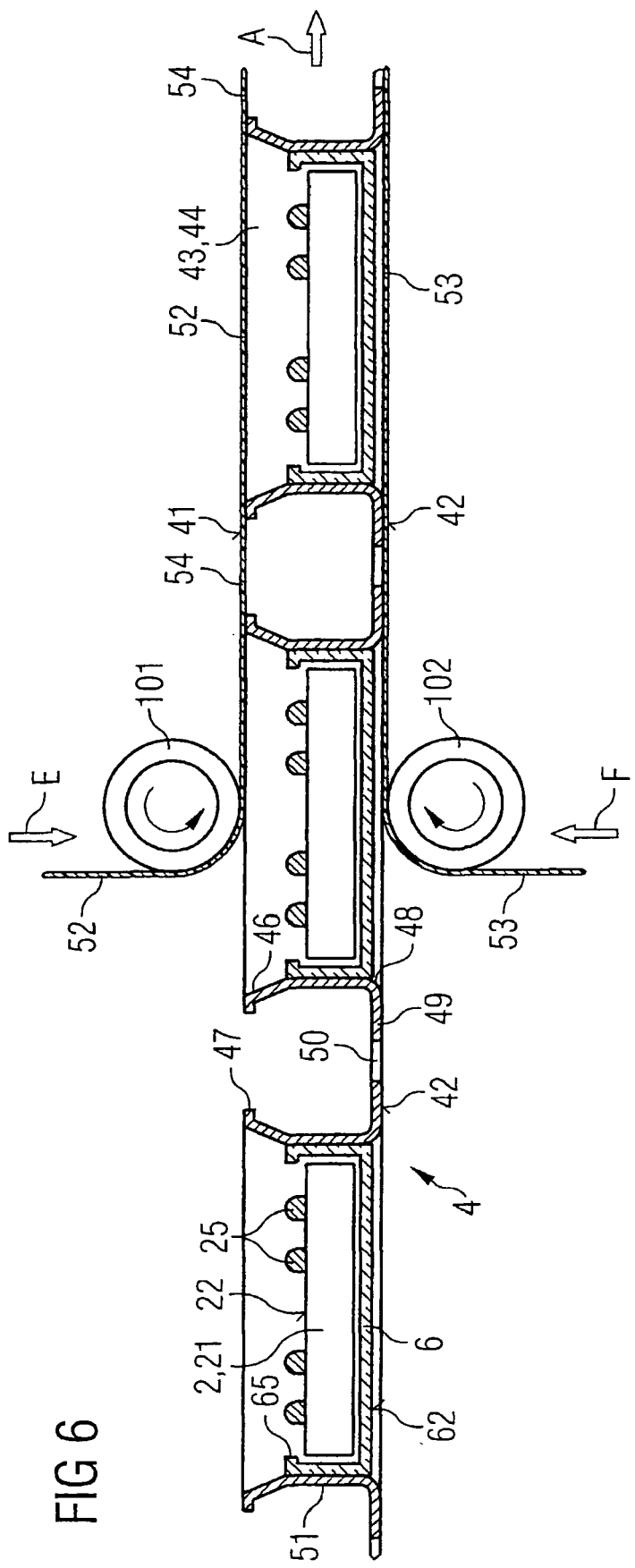
FIG. 6 illustrates a subsequent method step in which the belt-type carrier body is in each case provided with a lower and upper covering sheet.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIGS. 1 to 9 illustrate, in successive method steps, a method for packaging and for transporting electronic devices, and for the placement and for the withdrawal of electronic devices. In this case, identical parts are in principle provided with identical reference symbols and are therefore in part not explained multiply.

FIG. 1 illustrates a diagrammatic partial cross section through a belt-type carrier body 4 having a belt underside 42 and a belt top side 41. The belt underside 42 is subdivided into lower connecting sections 49 in the form of flat connecting strips, which may if appropriate have a perforation 50, and also into receptacles 43 each having a passage opening 44. The funnel-shaped receptacles 43 are in each case spaced apart regularly from one another and are in each case connected to the lower connecting sections 49 at a lower edge 48. Each of the receptacles 43 has a constricted central region 51, the inner wall 45 of which has a straight section perpendicular to the belt top side or underside 41, 42.

Upwardly, that is, toward the belt top side 41, each receptacle 43 is widened slightly, an upper edge 46 merging with a collar region 47 turned outward. This slightly widened contour facilitates the insertion of receptacles 6 that are in turn provided for receiving electronic devices 2 (cf. FIGS. 2 and 5).

FIG. 2 illustrates, in a subsequent method step, a diagrammatic partial cross section through the belt-type carrier body 4 with shell-type coverings 6 pressed therein. The arrow A illustrates a conveying direction of the belt-type carrier body 4. The arrow B illustrates a placement direction of a covering 6, which runs perpendicular to the conveying direction A and in the direction of the passage opening 44 of the receptacle 43. The coverings 6 are pressed into the funnel-shaped receptacles 43 perpendicularly from above.

Each of the coverings 6 has a shell- or pot-type cross section with an open front side 61 into which an electronic device can be inserted (cf. FIG. 5). The dimensions of the receptacles 43 and of the outer contours of each covering 6 are dimensioned such that the coverings 6 can be pressed into the receptacles 43 in a friction-locking manner, the outer side face 64 of the covering bearing in the central region 51 of the inner wall 45 of the receptacles 43 in a friction-locking manner.

The receptacles 6 pressed into their respectively envisaged position are illustrated on the basis of the two right-hand receptacles 43 of the belt-type carrier body 4. In one embodiment, the coverings 6 are not pressed in to such an extent that their closed rear side 62 is flush with the belt underside 42, rather that a small distance remains between them.

FIG. 3 illustrates a further method step, in which the coverings 6 are provided with an indexing or a marking. For this purpose, a stamp 81 may be pressed onto the closed rear side 62 of each covering 6 and leave behind an indexing or marking there. The pressing-on direction C of the stamp 81 is indicated by an arrow. The indexing or marking may assume various forms, for example, a color code or a bar code or a numbering.

At the same time as the stamp 81 is pressed on, in the opposite direction a counterbearing 82 may be pressed onto the open front side 61 of the covering 6 provided with a marking or indexing, this being illustrated with reference to FIG. 4. The pressing-on direction D of the counterbearing 82 is illustrated by an arrow.

As an alternative to an indexing by means of a stamp 81, the coverings 6 may also be provided with an indexing that is applied by means of a laser writer. The pressing-on element designated as counterbearing 82 may in this case serve as a cooling apparatus for dissipating the thermal energy applied by the laser.

With the pressed-in coverings 6, the highly flexible belt-type carrier body 4 may be rolled up onto a roll. This state corresponds to an initial state in which the fashioned rolls are supplied to a placement device in order to be populated with electronic devices. For example, the carrier body 4 may comprise a suitable plastic or, if appropriate, may also comprise pulp.

FIG. 5 illustrates a further method step in which the belt-type carrier body 4 is unrolled again and populated with electronic devices 2. In this case, an electronic device, indicated as semiconductor chip 21 in the present exemplary embodiment, is in each case inserted into each open front side 61 of each covering 6. The placement direction of each semiconductor chip 21 is illustrated by the arrow B.

The semiconductor chip 21 is inserted into the covering 6 in such a way that a passive rear side 23 is located on the open front side 61 of the covering and that chip side edges 24 are enclosed by inner side faces 63 of the covering. The drawn-in edge 65 of the covering 6 projects slightly above the semiconductor chip 21 and lies above the level of the active front side 22 thereof. On this active front side 22, the semiconductor chip in the exemplary embodiment shown is provided with external contacts 25 in the form of contact bumps.

Instead of the semiconductor chip 21 shown, in principle any desired electronic devices 2 can be packaged and transported by this method according to the invention.

In a further method step illustrated with reference to FIG. 6, the belt-type carrier body 4 is provided with an upper and a lower covering sheet 52, 53, which in each case close off the receptacles 43 that are open on both sides with the coverings 6 and semiconductor chips 21 inserted therein. For this purpose, an upper covering sheet 52 is applied to the belt top side 41, said covering sheet being supplied by means of a rotating upper deflection roll 101 in a conveying direction E with the belt-type carrier body 4 simultaneously moving in the conveying direction A, and being applied to the collar region 47 of each receptacle 43 in adhering fashion.

In the same way, a lower covering sheet 53 is applied to the belt underside 42, said covering sheet being supplied in the conveying direction F in the direction of the belt-type carrier body via the lower deflection roll 102 and being applied to the lower connecting sections 49 of the belt-type carrier body in adhering fashion.

After the passage openings 44 of the receptacles 43 have been closed off, the belt-type carrier body 4 is heated, the coverings 6 that shrink under the action of heat being joined firmly around the semiconductor chip 21. In this case, the coverings 6 are at the same time released from the inner wall 45 of the receptacles 43. The electronic devices 2 with the firmly applied covering 6 can thus fall around loosely within the receptacles 43 of the belt-type carrier body that are closed off with upper and lower covering sheets 52, 53. However, on account of the dimensions of the closed-off receptacles 43, the movement of the electronic devices 2 is limited such that a rotation of the electronic devices 2 is not possible. Consequently, they are always situated in a defined position of their active front sides 22 directed either toward the belt top side or toward the belt underside.

At the same time, as a result of the heating, the lower and upper covering sheets 53, 52 are firmly connected to the belt-type carrier body 4 and close off the receptacles 43.

FIG. 8 furthermore illustrates a belt-type carrier body 4 which has been turned through 180° and in the case of which parts of the upper covering sheet 52, which now lies at the bottom, have been removed, namely upper connecting sections 54 in each case between two adjacent receptacles 43. This promotes the mobility of the belt-type carrier body 4, which, in this way, can be wound up significantly better onto a roll since a deformation merely of the lower connecting sections 49 and of the lower covering sheet applied thereto is necessary, which is additionally facilitated by the perforations 50.

Finally, FIG. 9 illustrates a withdrawal of the electronic devices 2 in a withdrawal direction G oriented perpendicular to the conveying direction A of the belt-type carrier body 4. For this purpose, the lower covering sheet 53 lying at the top is stripped away in a conveying direction F upward. The electronic devices 2 lying loosely in the receptacles 43 that are open on one side can be withdrawn from the open receptacles in the withdrawal direction G. This may be effected for example by means of vacuum forceps or the like.

The covering sheets 52, 53 may be identical at the top and bottom. However, in order to identify the side toward which, for example, the external contacts 25 of the packaged electronic device 2 to be transported are arranged, the covering sheets 52, 53 may be formed differently by means of different coloration, by means of different imprint or by means of corresponding identification.

Since the electronic devices 2 lie loosely in the receptacles 43 and have restricted mobility, there is the risk of the belt-type carrier body 4 being charged electrostatically. What is possible, in particular, is the risk of electrostatic charging of the carrier body 4 by the unrolling of the belt-type tape on the various transport and conveying rolls. In order to combat this risk, the belt-type carrier body 4 may comprise pulps and, in one embodiment, paper. The pulps and in particular the paper have the property of adapting to the air humidity and thus avoiding a static charging.

As an alternative, the belt-type carrier body 4 may comprise plastic, in one embodiment, polymer plastic. However, these plastics tend toward being charged electrostatically. Therefore, the carrier body in one embodiment has a filler introduced in the plastic. In one embodiment the filler is carbon or graphite. On account of their electrical conductivity, these fillers prevent the carrier body 4 from being charged. As an alternative, the covering sheets 52, 53 may be plastic sheets that are provided with a conductive coating in order to avoid electrostatic charging. The conductive coating may be applied or imprinted for an identification of the position of the electronic devices 2 with respect to the belt top side 41 and the belt underside 42.

It is also possible for the covering sheets 52, 53 to comprise a pulp layer. However, this pulp layer has the disadvantage that it cannot be embodied in transparent fashion, so that the position of the electronic device 2 cannot be visually inspected directly through the covering sheets. This means, on the other hand, that the plastic sheets are restricted which permit at least in transparent fashion a view of the electronic devices in the passage openings of the carrier body.

The placement direction of the apparatus may optionally be identical or opposite to the withdrawal direction. The belt-type carrier body in one embodiment has a single row with an arbitrary number of receptacles 43. This results in a tape that can be wound up with electronic devices 2 in a defined position within the arbitrary number of receptacles 43. On account of the size of the receptacles being adapted according to one embodiment of the invention to the device size, the devices 2 maintain this position in all transport positions and can be withdrawn from the carrier body by the customer, for example by means of an automatic placement machine for printed circuit boards, in a predetermined position and order.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for placement and withdrawal of electronic devices relative to an apparatus having a belt-type carrier body with a belt top side, a belt underside, and receptacles that are open on both sides therebetween, comprising:
    populating the receptacles with coverings that are shrinkable under the action of temperature to produce a force-locking connection;
    populating the coverings with the electronic devices;
    closing off the belt top side and the belt underside of the belt-type carrier body with a covering sheet;
    heating the apparatus to produce a positively locking connection between the coverings and the electronic devices; and
    withdrawing the electronic devices via the removal of the covering sheet.

2. The method of claim 1, further including turning the apparatus 180° and wherein the removal of the covering sheet includes removing the covering sheet adjacent the belt underside.

3. The method of claim 1, wherein the removal of the covering sheet includes removing the covering sheet adjacent the belt top side.

4. The method of claim 1, wherein the direction of placement and withdrawal of electronic devices is normal to a direction of movement of the apparatus.

5. A method comprising:
    placing case coverings into receptacles that are open on both sides of an apparatus having a belt-type carrier body with a belt top side and a belt underside, wherein the case coverings are characterized in that they shrink when heated;
    inserting electronic devices into the case coverings within the receptacles of the apparatus;
    closing off the belt top side and the belt underside of the belt-type carrier body with a covering sheet;
    heating the apparatus to produce a positively locking connection between the case coverings and the electronic devices inserted therein; and
    withdrawing the electronic devices by removing the covering sheet.

6. The method of claim 5, further comprising producing a force-locking connection between the case coverings and the electronic devices when the apparatus is heated.

7. The method of claim 5, further comprising separating the case coverings from inner walls of the receptacles when the apparatus is heated.

8. The method of claim 5, wherein the receptacles are open on both belt top side and the belt underside of the belt-type carrier body of the apparatus.

9. The method of claim 5, further comprising inverting the apparatus such that the position of belt top side and a belt underside are reversed, and wherein the removal of the covering sheet includes removing the covering sheet adjacent the belt underside.

10. The method of claim 5, wherein the removal of the covering sheet includes removing the covering sheet adjacent the belt top side.

11. The method of claim 5, wherein the direction of placement and withdrawal of electronic devices is normal to a direction of movement of the apparatus.

* * * * *